(12) United States Patent
Schenker et al.

(10) Patent No.: US 7,816,061 B2
(45) Date of Patent: Oct. 19, 2010

(54) LITHOGRAPHY MASKS FOR IMPROVED LINE-END PATTERNING

(75) Inventors: Richard Schenker, Portland, OR (US); Swaminathan Sivakumar, Portland, OR (US); Paul Nyhus, Portland, OR (US); Sven Henrichs, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 625 days.

(21) Appl. No.: 11/820,420

(22) Filed: Jun. 19, 2007

(65) Prior Publication Data

US 2008/0318137 A1    Dec. 25, 2008

(51) Int. Cl.
*G03F 1/00* (2006.01)
*H01L 21/00* (2006.01)

(52) U.S. Cl. .......................................... 430/5; 430/311

(58) Field of Classification Search ................... 430/5, 430/30, 311, 312, 313, 394; 716/19, 20, 716/21
See application file for complete search history.

(56) References Cited

U.S. PATENT DOCUMENTS

| | | | | |
|---|---|---|---|---|
| 6,566,019 B2 * | 5/2003 | Kling et al. | ..................... | 430/5 |
| 7,326,501 B2 * | 2/2008 | Tejnil | ............................ | 430/4 |
| 7,445,874 B2 * | 11/2008 | Tan et al. | ....................... | 430/5 |

\* cited by examiner

*Primary Examiner*—Stephen Rosasco
(74) *Attorney, Agent, or Firm*—Caven & Aghevli LLC

(57) ABSTRACT

In one embodiment, a mask for use in semiconductor processing comprises a first region formed from a first material that is primarily opaque, a second region formed from a second material that is primarily transmissive, and a third region in which at least a portion of the second material is removed to generate a phase shift in radiation applied to the mask.

15 Claims, 8 Drawing Sheets

LITHOGRAPHY MASKS FOR IMPROVED LINE-END PATTERNING

BACKGROUND

The subject matter described herein relates generally to semiconductor processing, and more particularly to lithography masks.

Line-ends are generally structures of a semiconductor layer design that are highly susceptible to process variations including focus variations, dose variations and variations in mask making. The sensitivity to mask size variations is especially problematic. For example, spaces facing each other at tight chrome separation on a photomask suffer from significant pullback. Moreover, there is significant variability of the minimum end-to-end structure due to high MEEF (mask edge error factor), which may result in poor pattern fidelity and inability to meet tight design rules. The current state of the art depends on other MEEF-mitigation schemes like high NA, resolution enhancement techniques, etc. to control the problem, with limited success. Patterning of such end-to-end structures is a key limiter for design-rule scaling.

BRIEF DESCRIPTION OF THE DRAWINGS

The disclosed embodiments will be better understood from a reading of the following detailed description, taken in conjunction with the accompanying drawings in which.

DETAILED DESCRIPTION

The ability to pattern semiconductor patterns in lithography is generally not limited by the patterning of simple long-edged patterns but rather by the patterning of short-edged patterns such as line-ends. Line-ends are generally more susceptible to process variations including focus variations, dose variations and variations in mask making. The sensitivity to mask size variations is especially problematic. This invention provides a mask structure and integrated mask making flow for reducing the variation of line-end patterning on the wafer.

Figure 1:
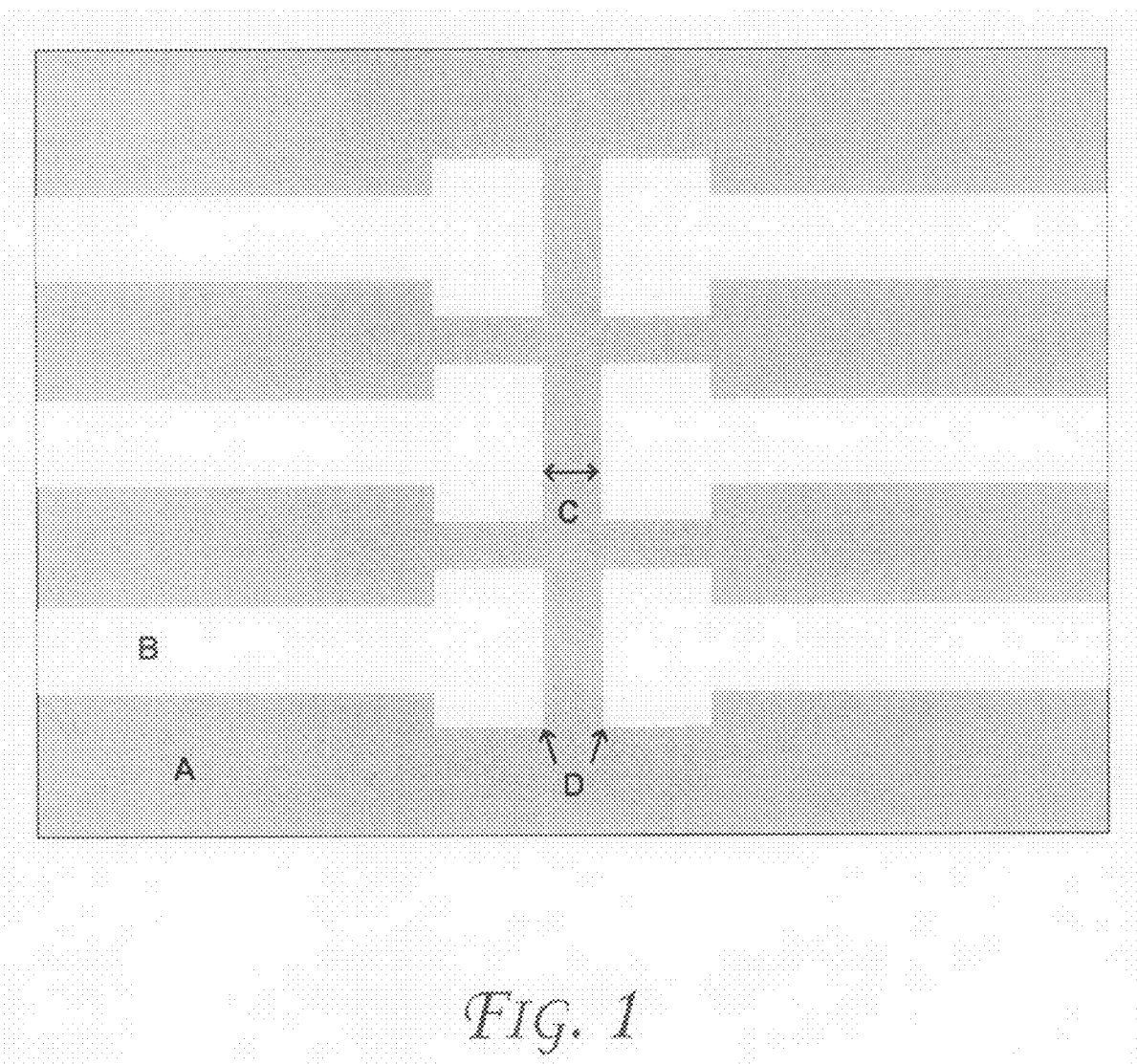
FIGS. 1-5 are schematic illustrations of mask designs for patterning line ends, according to embodiments.

FIG. 1 is a schematic illustration of a mask design for patterning line-ends. In the embodiment depicted in FIG. 1, a line-end occurs at the termination of a bright mask pattern that would form a resist trench if a positive photo-resist were used in the patterning process, which is generally the case. The structure depicted in FIG. 1 is designed to pattern six line-ends (see FIGS. 6A-6B) in which line-ends may be patterned close to each in order to reduce the area of a chip needed to create a semiconductor structure. Region A, designated by dark gray shading, is generally primarily opaque (i.e., transmission between 0 and 25%) and may be formed from a material like Chrome or MoSi. Region B is generally primary clear and may be formed from glass. Region C denotes area on mask that require a relatively small space on mask. Region D denotes locations on mask with sharp corners. The presence of sharp corners and small spaces on a mask generally makes it more difficult to manufacture with good uniformity.

Figure 2:
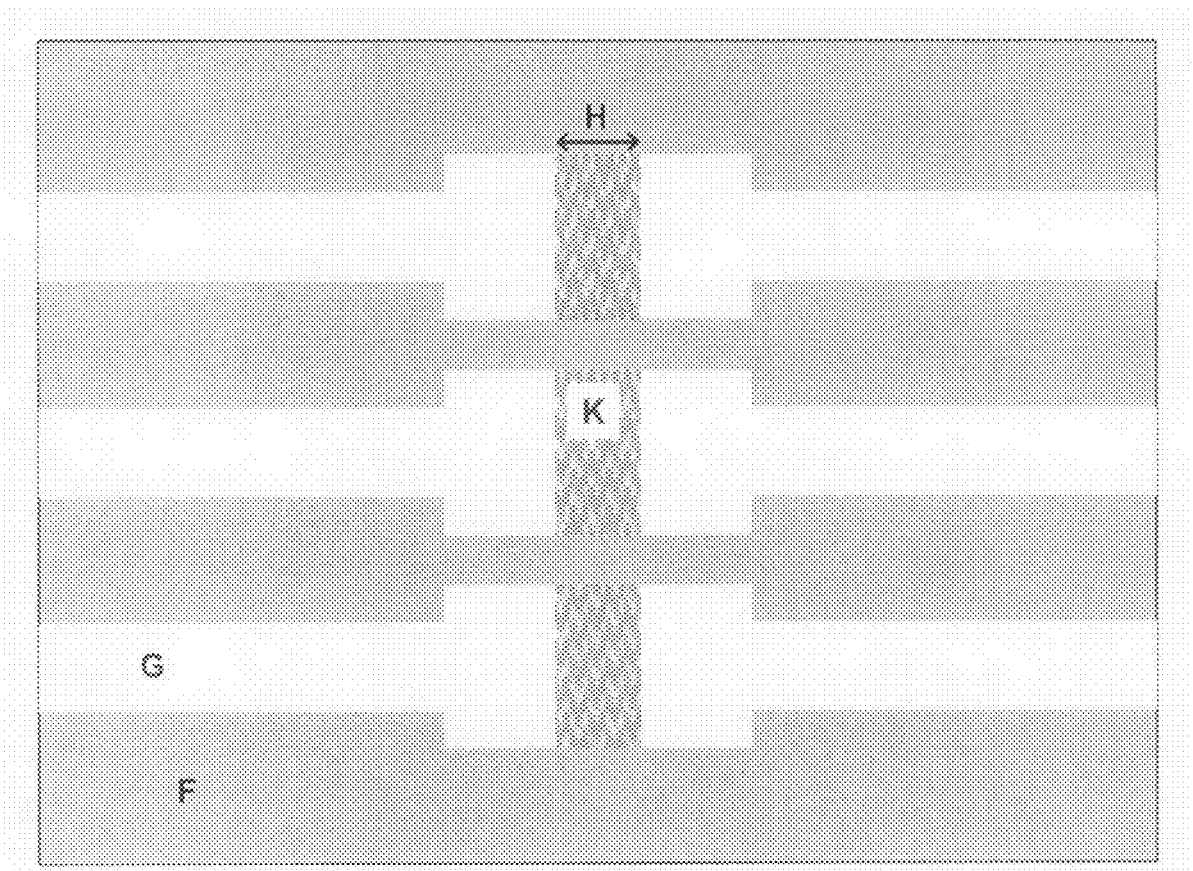

FIG. 2 is a schematic illustration of a mask structure for patterning line-ends on wafer. Region F is generally primarily opaque (transmission between 0 and 25%) using a material like Chrome or MoSi. Region G is generally primary clear (glass). Region K denotes a region where glass is etched to create a phase difference between it and region G. The depth of etch is proportional to the phase shift. In some embodiments, a phase shift of 90 to 180 degrees may be used. In some embodiments, the portion of second material in the third region is removed in order to generate a phase shift more than 20 degrees different than 180 degrees H denotes width of etched region. The mask structures are larger in FIG. 2 and are generally less complicated than those in FIG. 1, so and therefore have reduced variation for a given mask making technology. By using phase depths less than 180 degrees, larger width of etched region may be used, which can reduce the resolution requirements for mask patterning, as demonstrated in FIG. 7.

Figure 3:
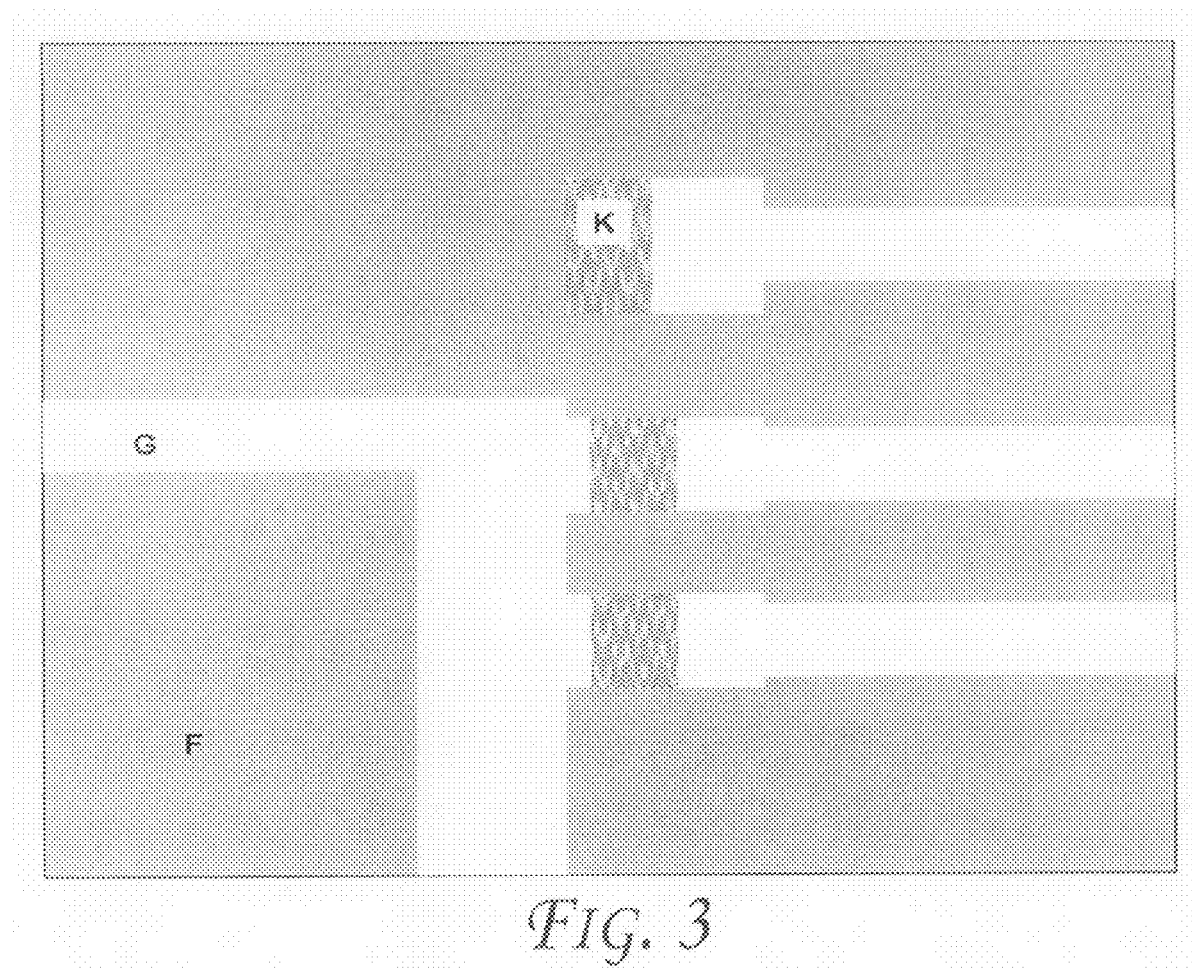

FIG. 3 is a schematic illustration of another example of a mask in which, instead of using phase edges to pattern the region between two line-ends as in FIG. 2, phase edges are used to pattern isolated line-ends and line-ends adjacent to long-edge structures.

Figure 4:
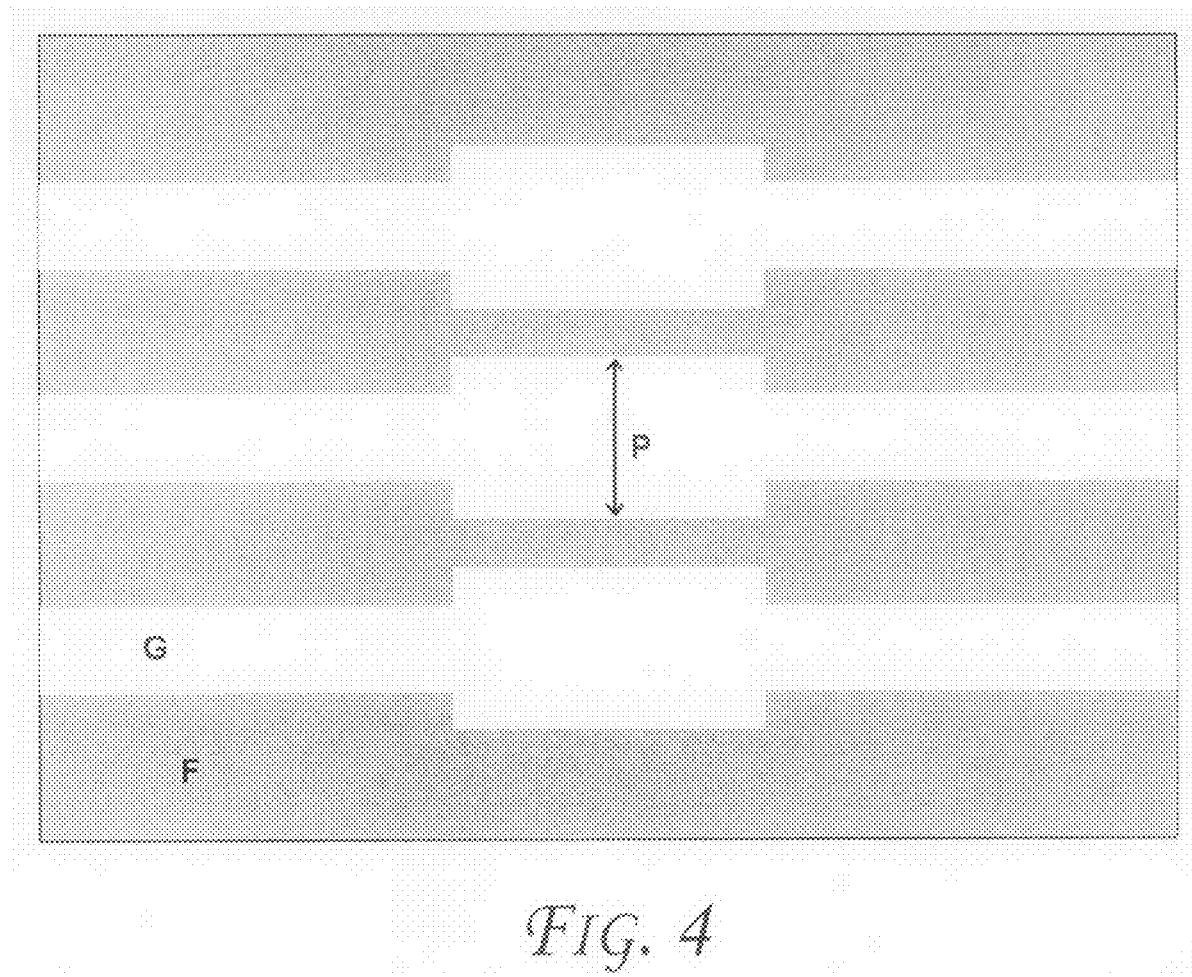

FIG. 4 is a schematic illustration of an operation in a patterning process in mask fabrication for the mask shown in FIG. 2. Mask patterns are generally formed by electron beam exposure. Mask pattern in the region that will define line-ends on wafer has a simple geometry that generally improves size uniformity across extent of full mask. Unlike the mask pattern shown in FIG. 1, the mask shapes do not have abrupt corners (i.e., having both a long vertical edge and a long horizontal edge) and they do not have small spacing in both the horizontal and vertical directions but rather only between horizontal features.

Figure 5:
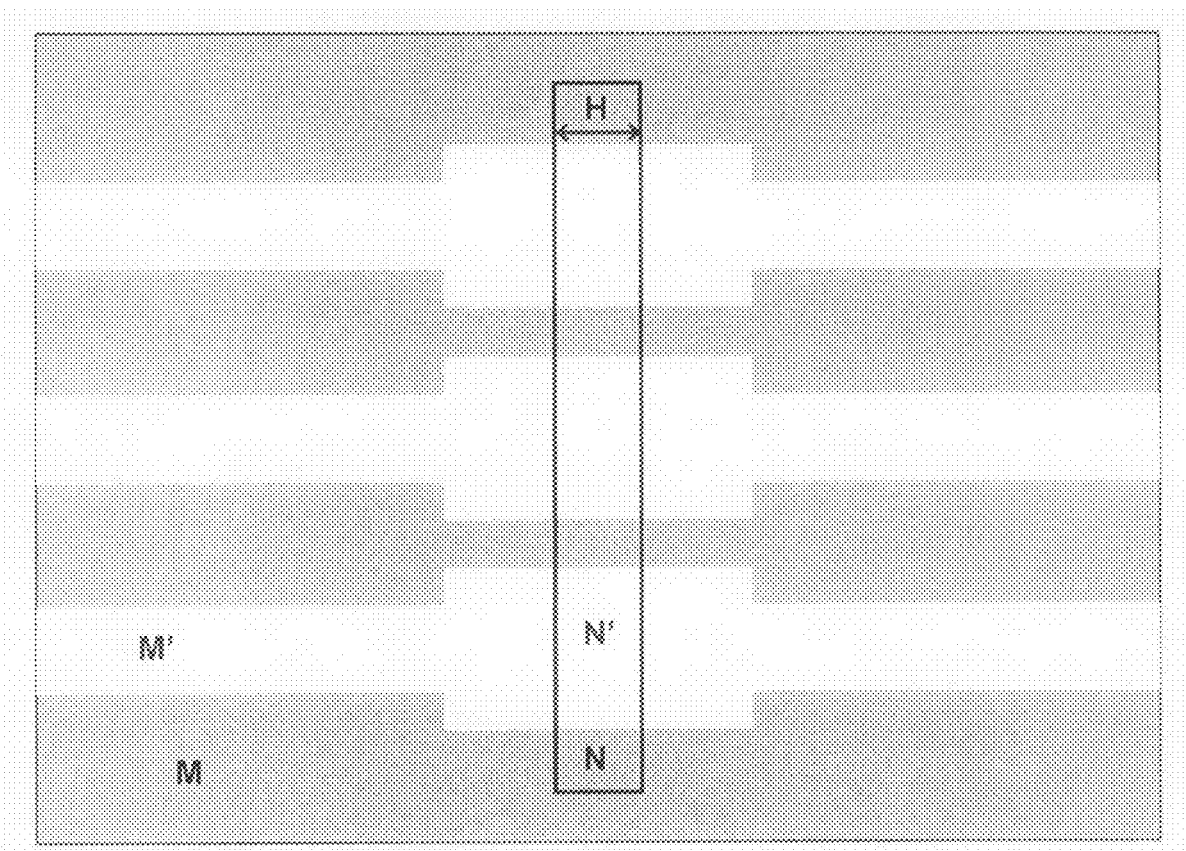

FIG. 5 is a schematic illustration of the mask shown in FIG. 2 after a second resist patterning step. Regions M and M' denotes areas on the mask that remain covered by resist after exposure while regions N and N' denotes areas on the mask where resist has been removed during exposure. Regions N' will have etched glass while regions N will not as glass is protected by opaque material. Regions M' will not have etched glass as resist will prevent glass etching in that area. The patterns defined during the second mask resist patterning step shown with width H do not have narrow widths or sharp corners in areas that impact wafer line-end patterning.

In some embodiments, effects of mask size non-uniformity can be further reduced by the mask-making flow described in this document. For example, the widths of mask features defined in the first mask patterning operation (FIG. 4, width P for example) can be measured across the extent of the entire mask (for a mask used with a 4× magnification system size of mask can be ~100 mm×150 mm). The approximate systematic size errors may then be extrapolated as a function of location on the mask. The targeted size of the sizes patterned may then be modulated with the second patterning step (FIG. 5, width H for example) to partially compensate for systematic size errors from the first patterning step.

Figure 6:
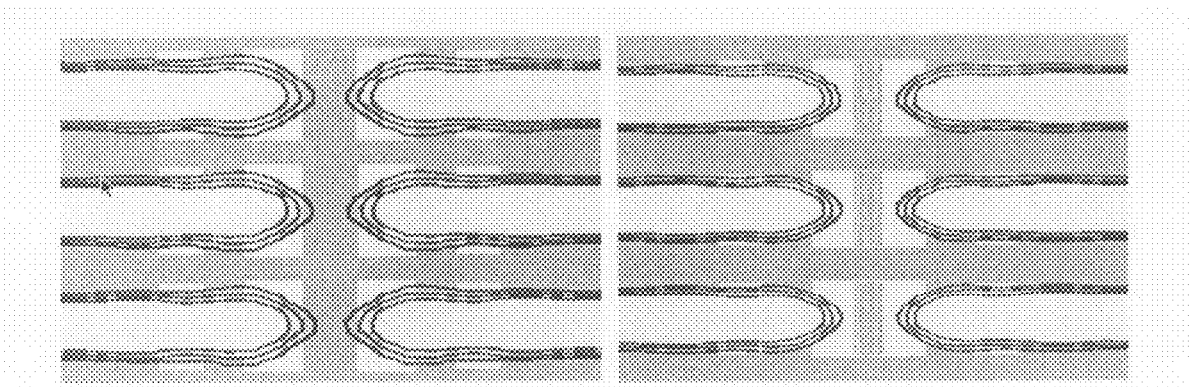
FIGS. 6-7 are schematic illustrations of a mask design for patterning line ends, according to embodiments.

FIG. 6 is a schematic illustration of a mask structure which may be used to provide improved sensitivity to variations in mask making. FIG. 6 shows the simulated line-end patterning with EPSM on left and phase-edge mask on right. Contours show expected wafer pattern as mask features are moved by 1, 0 and +1 nm per edge (wafer scale). Note that the mask structure on right shows improved sensitivity to mask size variations. Both masks may be designed such that the pitch of the horizontal resist trenches is 120 nm and the line-end to line-end spacing is 60 nm. An OPC tool may be used to adjust mask design in both cases so that wafer pattern matches design pattern at nominal patterning conditions. The mask on left is 6% transmission EPSM with 54 nm spacing between line-ends on mask. The mask on right uses 0% transmission material (such as chrome) and has a 30 nm wide, 180 degree phase edge between line-ends after OPC. Simulations for FIG. 6 use 193 nm wavelength, 0.93 numerical aperture and c-Quad illumination (0.8 to 0.975 sigma range, 30 degree total angle). Contours on right show changes in wafer contour locations resulting from mask size errors from the 1st mask patterning step only. MEEF (mask enhanced error factor) is simulated to be 11.5 for EPSM mask and 8.3 for line-end phase shift mask. All simulations use thin-mask approximations, use vector calculations with azimuthal polarization, and a simple resist model with a 19 nm resist diffusion length and 0.25 intensity threshold.

Figure 7:
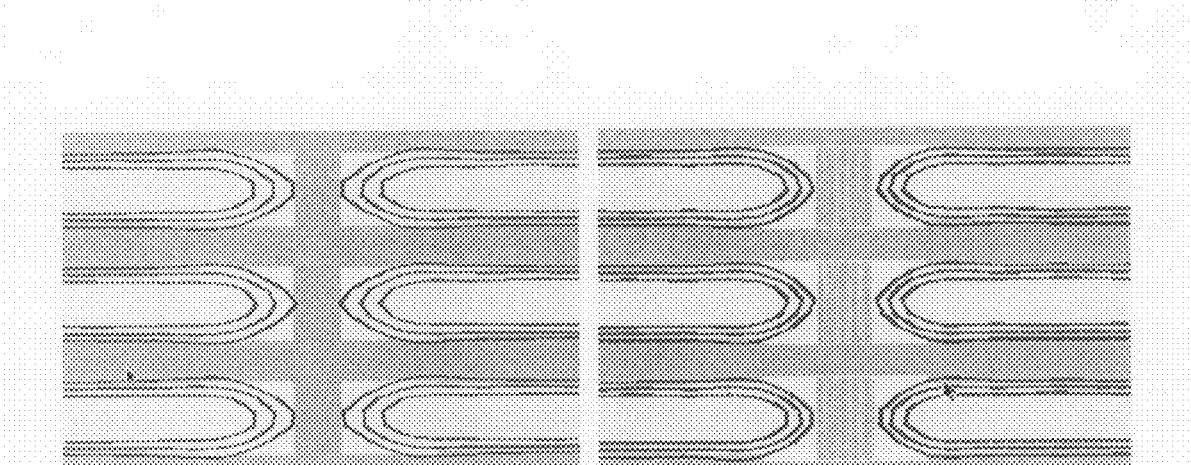

FIG. 7 is a schematic illustration of a second example of using a mask structure to improve sensitivity to process variations. The phase edge mask in FIG. 6 used chrome and a 180 degree phase edge while the phase edge mask in FIG. 7 uses a 6% EPSM material and a 100 degree phase edge. FIG. 7 shows the simulated line-end patterning with EPSM on left and phase-edge mask on right. Contours show wafer patterns as mask features are moved by 1, 0 and +1 nm per edge (wafer scale). Mask structure on right shows improved sensitivity to mask size variations. Both masks are designed such that the pitch of the horizontal resist trenches is 84 nm and the line-end to line-end spacing is 56 nm. An OPC tool is used to adjust mask design in both cases so that wafer pattern matches design pattern at nominal patterning conditions. The mask on left is 6% transmission EPSM with 32 nm spacing between line-ends on mask. The mask on right uses 6% transmission EPSM material and has a 37 nm wide, 100 degree phase edge between line-ends after OPC.

Simulations for FIG. 7 use 193 nm wavelength, 1.35 numerical aperture (water immersion system) and asymmetric c-Quad illumination (y-pole 0.8 to 0.975 sigma range, 30 degree total angle; x-pole 0.5 to 0.95 sigma range, 30 degree total angle, 0.33 weighted intensity). MEEF for EPSM is predicted to be 13.2 while MEEF from first level ebeam patterning step is predicted to be 8.4 for line-end phase shift mask. Dose sensitivity of line-ends patterned with EPSM mask is predicted to be 1.3 nm/1% dose variation compared to 1.2 nm/1% dose variation of line-end phase shift mask. Improved dose sensitivity is a result of improved image slope in region of line-end for the line-end phase shift mask compared to the EPSM.

Thus, a patterning process that uses a mask with phase edges to define line-ends coupled with asymmetric illumination (as illustrated in FIG. 7) gives a more robust patterning solution for several line-end structures compared to the use of only one of these technique by itself and either a conventional mask or symmetric illumination.

Figure 8:
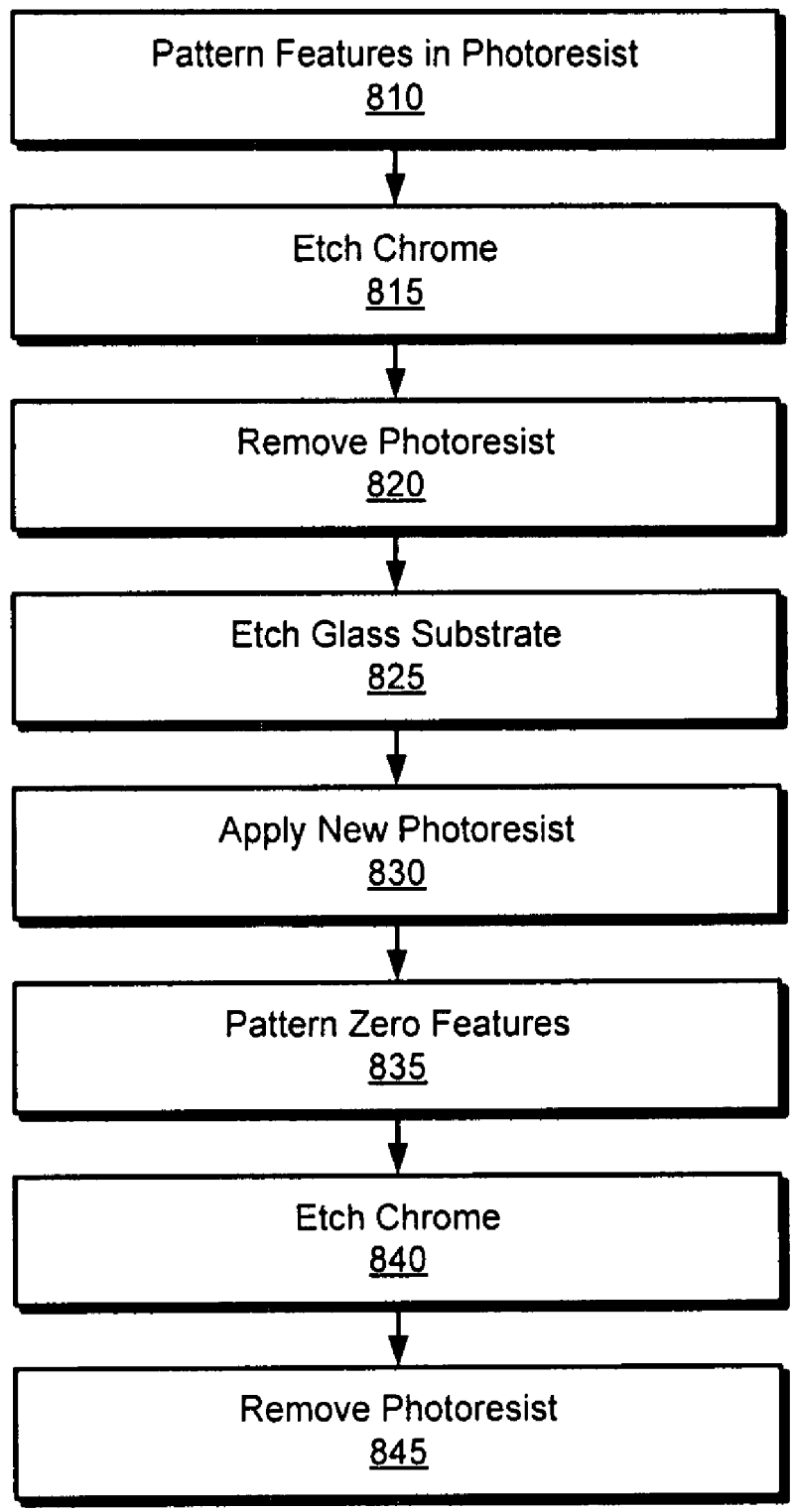
FIG. 8 is a flowchart illustrating a method detecting an alignment of a wafer, according to embodiments.
Figure 9A:
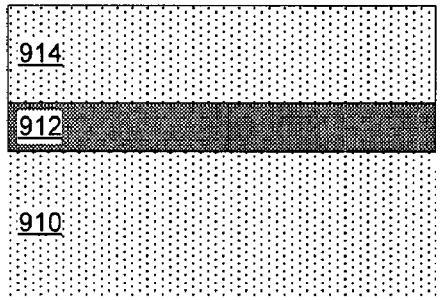
FIGS. 9A-9F are schematic illustrations of a mask design for patterning line ends, according to embodiments.
Figure 9B:
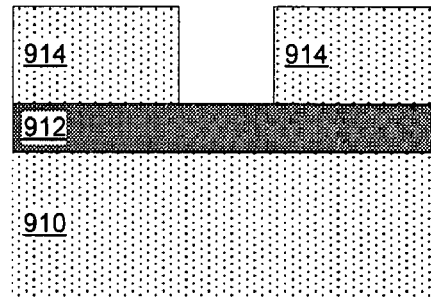

FIG. 8 is a flowchart illustrating a method of fabricating a phase edge mask, according to embodiments, and FIGS. 9A-9F are schematic illustrations of a mask design for patterning line ends, according to embodiments. Referring first to FIG. 9A, the method may be implemented on a mask structure that comprises a substrate 910 which may be formed from a transmissive materials such as, for example, glass, Quartz, or the like. A layer of substantially opaque material 912 is disposed on the substrate 910. Opaque material 912 may be formed from a material such as chrome or molybdenum silicon. A layer of photoresist 914 is disposed on the layer of all opaque material 912.

Figure 9C:
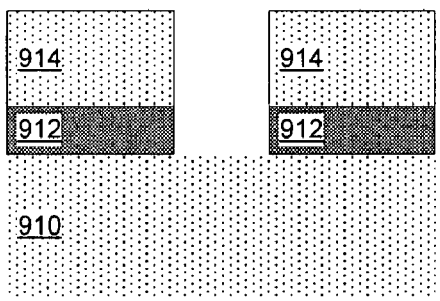
Figure 9D:
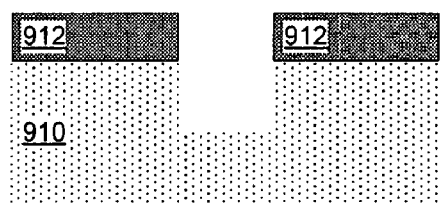
Figure 9E:
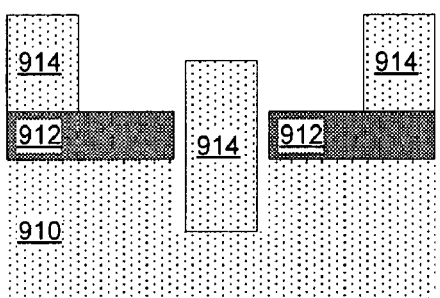
Figure 9F:
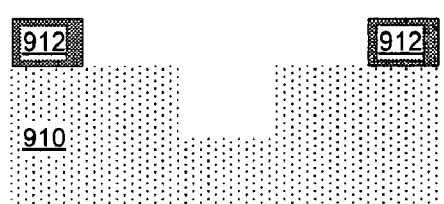

Referring to FIG. 8, at operation 811 or more features are patterned in the photoresist layer 914. For example, in the embodiment depicted in FIG. 9B, a trench is formed in the layer of photoresist 914. At operation 815; a portion of the substantially opaque material 912 is removed, for example, by a suitable etching process (FIG. 9C). At operation 820 the layer of photoresistive material 914 is removed (FIG. 9D). At operation 825 a portion of the glass substrate is removed, for example, by a suitable etching process (FIG. 9D). At operation 838 new layer of photoresistive material 914 is applied and at operation 835 portions of the new layer of photoresistive material 914 are selectively removed to expose portions of the opaque material 912 (FIG. 9E) in order to pattern one or more features. At operation 840 be exposed portions of the substantially opaque material 912 are removed, for example, by a suitable etching process and at operation 845 the remaining photoresist 914 is removed from the structure.

Therefore, the resulting structure comprises a first region formed from a first material that is primarily opaque, a second region formed from a second material that is primarily transmissive, and the third region in which at least a portion of the second material is removed to generate a dayshift and radiation apply to the mask.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" "some embodiments" or "an embodiment" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A mask for use in semiconductor processing, comprising:
    a first region formed from a first material that is primarily opaque;
    a second region formed from a second material that is primarily transmissive;
    a third region used to help pattern at least one line-end and which transmits light that is phase shifted with respect to light transmitting through the second region.

2. The mask of claim 1, wherein the first material comprises at least one of chrome or molybdenum silicon.

3. The mask of claim 1, wherein the second region comprises glass.

4. The mask of claim 1, wherein the portion of second material in the third region is removed in order to generate a phase shift more than 20 degrees different than 180 degrees.

5. The mask of claim 1, wherein the portion of second material in the third region is removed in order to generate a phase shift of approximately 180 degrees.

6. The mask of claim 1, wherein the third region comprises a third material that generates a phase shift compared to the second region.

7. The mask of claim 1, wherein the third region is used to pattern an area between two line ends on an underlying semiconductor material.

8. A method to form a semiconductor mask, comprising:
forming a first region formed from a first material that is primarily opaque;
forming a second region formed from a second material that is primarily transmissive;
forming a third region in which at least a portion of the second material is removed to generate a phase shift in radiation applied to the mask; and
adjusting one or more sizes of a feature of at least one region are adjusted based on a measurements of a size of a features of another region.

9. The method of claim 8, wherein forming a first region formed from a first material that is primarily opaque the first material comprises forming a first layer that comprises at least one of chrome or molybdenum silicon on a glass substrate.

10. The method of claim 9, wherein forming a second region formed from a second material that is primarily transmissive comprises:
forming a second layer of a photoresistive material on the first layer of primarily opaque material; and
patterning at least one feature in the second layer of a photoresistive material.

11. The method of claim 10, wherein forming a third region in which at least a portion of the second material is removed to generate a phase shift in radiation applied to the mask comprises removing at least a portion of the glass substrate.

12. The method of claim 11, wherein removing at least a portion of the glass substrate comprises:
etching at least a portion of the first layer;
removing the second layer of photoresistive material; and
etching a portion of the glass substrate.

13. The method of claim 12, further comprising:
forming a new layer of photoresistive material; and
etching a portion of the first layer.

14. The method of claim 8, wherein a size of one or more features formed during the patterning of the third region are adjusted based on a measurement of a feature formed during the patterning of the second region.

15. The method of claim 8, wherein a sizes of one or more features formed during the patterning of the second region are adjusted based on measurements of features formed during the patterning of a third region.

* * * * *

UNITED STATES PATENT AND TRADEMARK OFFICE
CERTIFICATE OF CORRECTION

PATENT NO. : 7,816,061 B2
APPLICATION NO. : 11/820420
DATED : October 19, 2010
INVENTOR(S) : Richard Schenker et al.

It is certified that error appears in the above-identified patent and that said Letters Patent is hereby corrected as shown below:

On Title page, in field (54), in "Title", in column 1, line 1-2, delete "LITHOGRAPHY MASKS FOR IMPROVED LINE-END PATTERNING" and insert -- LITHOGRAPHY MASKS --, therefor.

Column 1, line 1-2, delete "LITHOGRAPHY MASKS FOR IMPROVED LINE-END PATTERNING" and insert -- LITHOGRAPHY MASKS --, therefor.

Signed and Sealed this
Thirty-first Day of May, 2011

David J. Kappos
*Director of the United States Patent and Trademark Office*